United States Patent
Thurston

[19]

[11] Patent Number: 5,966,343
[45] Date of Patent: Oct. 12, 1999

[54] VARIABLE LATENCY MEMORY CIRCUIT

[75] Inventor: Paulette Thurston, Plano, Tex.

[73] Assignee: Texas Instruments Incorporated, Dallas, Tex.

[21] Appl. No.: 08/996,522

[22] Filed: Dec. 23, 1997

Related U.S. Application Data

[60] Provisional application No. 60/034,470, Jan. 2, 1997.
[51] Int. Cl.[6] .................................................. G11C 8/00
[52] U.S. Cl. ..................... 365/233; 365/233.5; 365/236
[58] Field of Search ..................................... 365/233, 236, 365/238.5, 189.05, 233.5

[56] References Cited

U.S. PATENT DOCUMENTS

| | | | |
|---|---|---|---|
| 5,386,385 | 1/1995 | Stephens, Jr. | 365/189.05 |
| 5,729,503 | 3/1998 | Manning | 365/233.5 |
| 5,802,005 | 9/1998 | Nakamura et al. | 365/230.03 |

*Primary Examiner*—David Nelms
*Assistant Examiner*—David Lam
*Attorney, Agent, or Firm*—Robert N. Rountree; Michael K. Skrehot; Richard L. Donaldson

[57] ABSTRACT

A memory integrated circuit includes a memory cell array, data lines 211 for transferring data to and from the memory cell array, data storage circuitry 200 coupled between the memory cell array and the data lines, and programmable circuitry 202, 206, 208 coupled to the data storage circuitry and responsive to control inputs and a clock signal for releasing data in the data storage circuitry. In further embodiments, the data storage circuitry includes a latch and the programmable circuitry includes circuitry for counting a predetermined number of cycles of the clock signal prior to releasing data in the data storage circuitry. The integrated circuit may also include circuitry 302 for transferring data to or from said array in a burst comprising a plurality of data bits.

21 Claims, 11 Drawing Sheets

VARIABLE LATENCY MEMORY CIRCUIT

This application claims priority under 35 U.S.C. § 119 (e)(1) of provisional application number 60/034,470, filed Jan. 2, 1997.

FIELD OF THE INVENTION

This invention generally relates to memory circuits, and more specifically to synchronous dynamic random access memory circuits.

BACKGROUND OF THE INVENTION

Dynamic random access memory circuits (DRAMs) are used in computers and other electronic machines needing temporary storage of data. These circuits have advantages over other types of memory circuits in that they provide the greatest density of memory cells for a given area of semiconductor, a low relative cost-per-bit of stored data, and relatively high speed. DRAMs have increased in both size and in operating speed to match the demands of system designers using modem microprocessors, which often have clock rates in excess of 100 MHz. Indeed, with each new generation of DRAM, the number of memory cells on the integrated circuit increases by a factor of four. In an effort to accommodate systems that demand more and faster data, the industry has turned to DRAMs that synchronize the transfer of data, addresses, and control signals with a clock signal, one that is typically tied to the microprocessor if the system is a computer.

While it is desirable to tie the functioning of the memory to an external clock to speed data transfer and synchronize data input and output, the array access complexity and routing parasitics due to the size of the circuits that must be accessed to store or retrieve data in a DRAM make it difficult for the memory circuit to respond on every cycle of a high-frequency clock. A solution to this problem is to allow for memory operation delay by a given number of cycles, but eventually have the memory store or retrieve data on the clock cycle as desired by the system designer. This delay in synchronous DRAMs is referred to as "latency." It is a common design practice for the latency of the memory circuit to be selectable by the system designer, typically in increments of 1, 2, 3, or 4 clock cycles, depending upon the operating frequency of the microprocessor upon which a computing system is based, for example.

The conventional method for implementing latency in memory circuits in the past has been to insert memory registers, similar to D-type flip-flops, in the input/output data paths. For example, if the system latency requirement is three system clock cycles for receiving read data, two registers are placed in each of the memory circuit's output data paths (the latency is three because during one cycle the data occupies a sense amplifier). For a system latency of two, only one register per data path is required. Latency in the write function is achieved through separate registers in the input data path. The memory circuit designer makes the latency selectable by providing circuitry that simply includes more registers in the data path to increase the latency of the memory circuit, or bypass a set of registers if less latency is achievable.

While conceptually simple, the circuitry for implementing the conventional latency scheme is cumbersome and occupies more die space than is desired. For example, each register requires approximately ten transistors for implementation. A memory circuit with 32 data lines, a four-cycle read latency, and a one-cycle write latency would require approximately 128 registers, or 1280 transistors, for implementation using the conventional approach. An added complication is that each data path on every die should be thoroughly tested prior to shipment to a customer. The large number of transistors involved in the latency circuitry certainly adversely affects the yield and increases the test time of DRAMs. These problems motivate the need for a new approach to memory circuit designs.

SUMMARY OF THE INVENTION

In accordance with a preferred embodiment of the invention, there is disclosed herein a memory integrated circuit. The integrated circuit includes a memory cell array, data lines for transferring data to and from the memory cell array, data storage circuitry coupled between the memory cell array and the data lines, and programmable circuitry coupled to the data storage circuitry that is responsive to control inputs and a clock signal to releasing data in the data storage circuitry. In further embodiments, the data storage circuitry includes a latch, and the programmable circuitry includes circuitry for counting a predetermined number of cycles of the clock signal prior to releasing data stored in the data storage circuitry. The integrated circuit may also include circuitry for transferring data to or from said array in a burst comprising a plurality of data bits.

Further in accordance with an embodiment of the invention, there is disclosed a method for coordinating input and output of data from a memory cell array with a clock signal. The method includes the steps of storing data to be transferred to or from the memory cell array in data storage circuitry connected to the memory cell array, counting a predetermined number of cycles of the clock signal, providing a signal to the data storage circuitry after the lapse of the predetermined number of clock cycles, and releasing the stored data.

An advantage of the circuits and methods is that the latency involved in transferring data to or from a memory cell array can be provided with less and simpler circuitry than has been used in prior approaches. In addition, the use of latency implementation circuitry that is common to both the read and write data paths makes for more economical testing of the latency circuitry in that fewer data paths must be checked for defects.

BRIEF DESCRIPTION OF THE DRAWINGS

The foregoing features of the present invention may be more fully understood from the following detailed description, read in conjunction with the accompanying drawings, wherein:

FIG. 8, comprising

FIG. 10, comprising

DETAILED DESCRIPTION OF PREFERRED EMBODIMENTS

Figure 1:
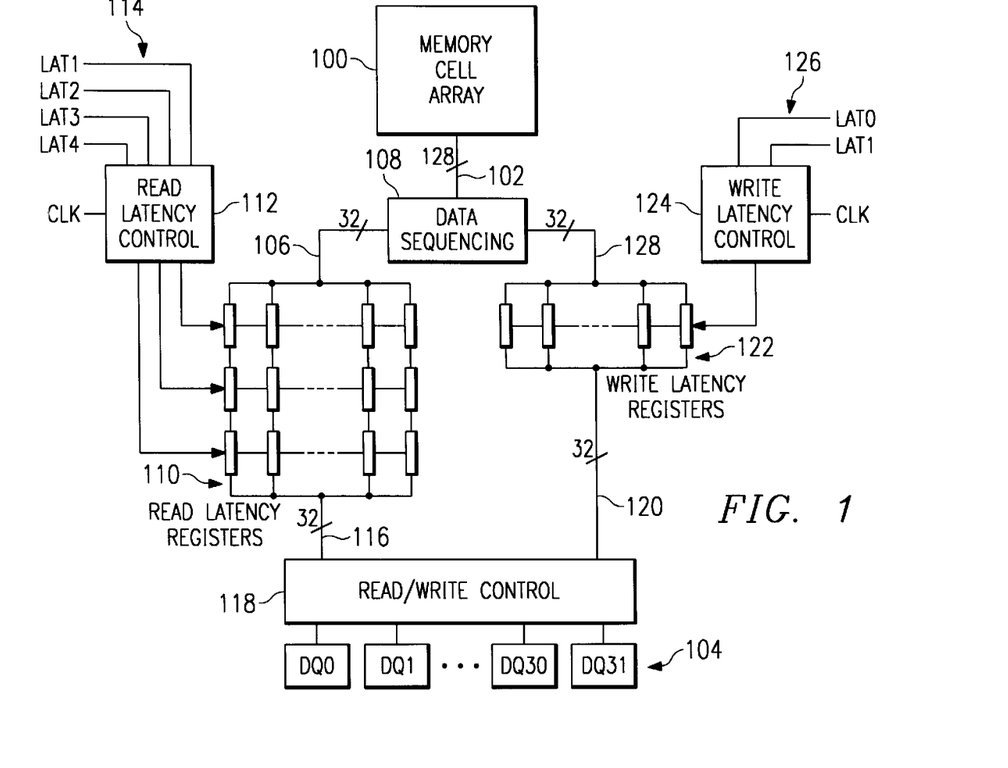
FIG. 1 is a schematic diagram of a memory circuit that incorporates stacked registers to implement latency.

FIG. 1 is a schematic depiction of circuitry to implement latency using the conventional method of stacking registers. Data is input to or taken from memory cell array 100 via global I/O lines 102 of which there are 128 in this implementation. This number of global I/O lines is consistent with four banks of memory cells and a 32-bit wide input/output interface 104 as is particularly found in the 64 and 256 Mbit generations of DRAM. Latency control may of course be made independent of the array architecture and number of input/output lines in the memory circuit. The features disclosed here are equally applicable to DRAMs smaller and larger in the number of bits that may be stored and in the breadth of the I/O interface.

In FIG. 1 there are four global I/O lines 102 for each of the lines 106 leading to the DQ data pads at the input/output interface 104. This allows for data to be pre-fetched during a read command in groups of four as described in commonly-owned U.S. applications: Ser. Nos. 60/021,565; 60/021,567; and 60/021,524, which are herein incorporated by reference. The data on the global I/O lines 102 is sequenced by circuitry in block 108 and routed through read latency registers 110. The read latency registers 110 are configured in FIG. 1 to provide for between one and four clock cycles of latency. The amount of latency is selected by the system designer by entering data into a mode set register elsewhere in the integrated circuit. The latency selection is communicated to read latency control block 112 in FIG. 1 along one of four lines 114, for example. The read latency control block 112 then activates the number of sets of registers in the read latency registers 110 to produce the desired latency. For example, if a latency of one is desired, data on lines 106 bypasses all of the sets of registers. If a latency of two is desired, data on lines 106 passes through one of the sets of registers, and so forth. The data exits the read latency registers 110 and passes on lines 116 to read/write control block 118, which contains circuitry for routing data through the read and write branches of the circuit.

Data that is to be written into the memory cell array is presented on the DQ pads at the input/output interface 104 and routed by the read/write control block 118 along lines 120 to the write latency registers 122. The system designer selects either no latency or a latency of one cycle and inputs that command in the mode set register referred to above. The latency information from the mode set register enters the write latency control block 124 on lines 126, for example. If no write latency is desired, the set of write latency registers is bypassed by the incoming data. If, however, a write latency of one is desired, the write latency control block 124 is activated and the data to be written passes through the registers along lines 128 where it is sequenced in block 108 and routed along global I/O lines 102 into the memory cell array 100.

One drawback of the circuit shown in FIG. 1 is the number of registers required to implement the read and write latency registers. At about ten transistors per register, the total transistors required to implement this scheme is at least 1280, (3×32×10+1×32×10), not including the control circuitry. The large number of transistors results in a circuit that occupies a large amount of die space and that is prone to a lower yield than might be expected with fewer transistors. In addition, the number of operations to test the many data paths involved in this circuit is time-consuming and uneconomical. The handling of read and write latencies in different branches of the circuit only adds to the complexity.

Figure 2:
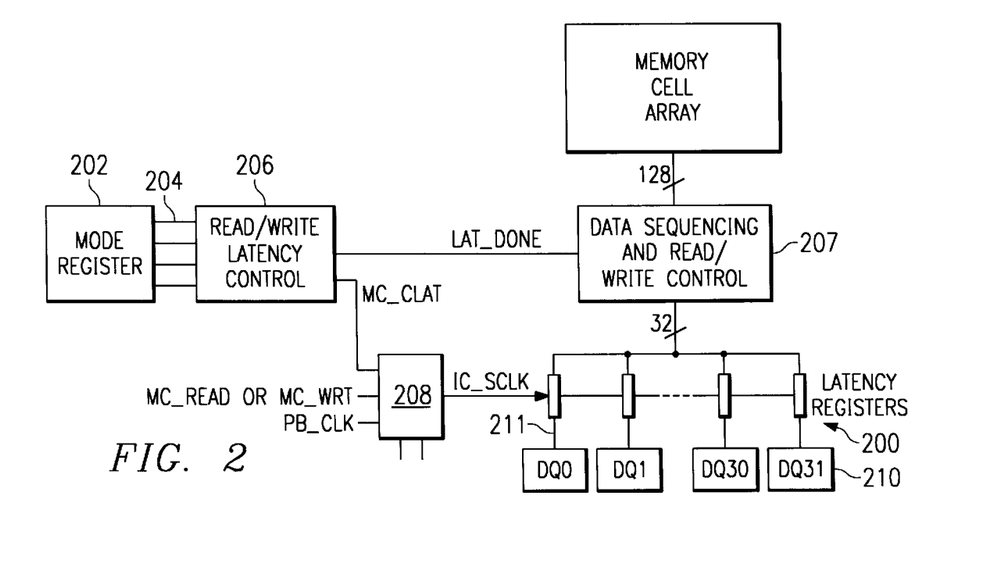
FIG. 2 is a schematic diagram of a preferred embodiment memory circuit latency scheme.

A preferred embodiment of the invention is shown in FIG. 2 and is a much simpler latency implementation than the scheme of FIG. 1. For example, only one set of latency registers 200 is involved and both read and write latencies can be handled by this single set of registers. One should note that the term "latency register" as used to describe embodiments herein refers to a latch or flip-flop, but that other forms of data storage circuitry such as shift registers or serial registers may alternatively be used. As in the implementation shown in FIG. 1, the desired level of read and write latency is chosen at the memory circuit level by an input to the mode register 202 that is common to synchronous DRAMs. The read and write latency information, including the latency period and whether the period is for a read or write cycle, is transferred from the mode register 202 along lines 204 to the read/write latency control block 206. The variable latency that is accomplished in FIG. 1 by selecting a number of sets of registers is accomplished in the circuit of FIG. 2 by a counter in the read/write latency control block 206. During a read command, for example, a variable down counter in block 206 counts down the number of latency cycles stored in the mode register 202. When the latency count finishes, the signal LAT_DONE is sent to data sequencing and pre-fetch control circuitry block 207, for example, indicating that the read latency is done and that bits can now be transferred. In addition, an MC_CLAT signal is sent to block 208 so that in conjunction with the read signal and a rising edge of the system clock, PB_CLK, the clocking of the latency registers 200 is enabled to transfer data from the latency registers 200 to the DQ output pads 210 on data lines 211. The write latency is handled in an analogous manner, but with the data being presented initially on the DQ output pads 210, and then being clocked into the latency registers 200.

Since a decrementing or "down" counter can generally be implemented with less logic circuitry than an incrementing or "up" counter, the down counter is preferred in this embodiment. It will, however, be apparent to the skilled artisan that either form of counter may be used effectively.

Figure 3:
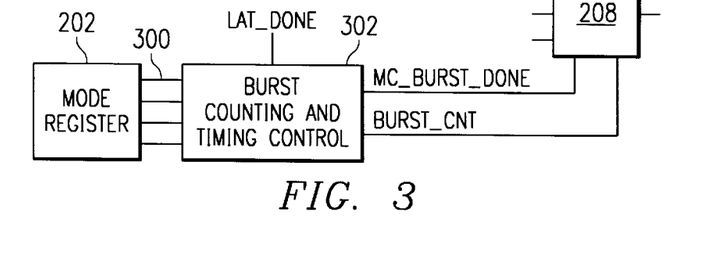
FIG. 3 is a supplementary circuit to that of FIG. 2 implementing burst control.

FIG. 3 is a supplement to FIG. 2 and is a schematic representation of the burst control circuitry for the memory circuit. Data for the memory circuit is written or read in a burst fashion, meaning that a single starting address is entered into the memory circuit and the memory circuit then internally addresses a sequence of locations based on that starting address. Some of the subsequent accesses after the first may be preceding as well as succeeding column addresses depending upon the starting address entered. This sequence can be programmed to follow either a serial burst or an interleave burst pattern. In either mode, after the initial output cycle has commenced, the data burst occurs at the clock frequency without intervening gaps. The length of the burst sequence can be user-programmed to be 1, 2, 4, or 8 bit accesses, for example. After a read burst is completed, as determined by the programmed burst length, the data outputs are in a high impedance state until the next read access is initiated.

In FIG. 3 the burst length and other information is transferred from the mode register 202 by lines 300 to burst counting and timing control circuitry block 302. Burst control block 302 also includes a variable down counter to determine when the number of clock cycles corresponding to the desired burst length has elapsed. When the desired burst has occurred, the signal MC_BURST_DONE is sent to the clock enabling block 208 to terminate the clocking of data through registers 210. The burst count value, BURST_CNT, is also sent to the clock enabling block 208 where it is used to generate the IC_SCLK signal to be discussed below.

Figure 4:
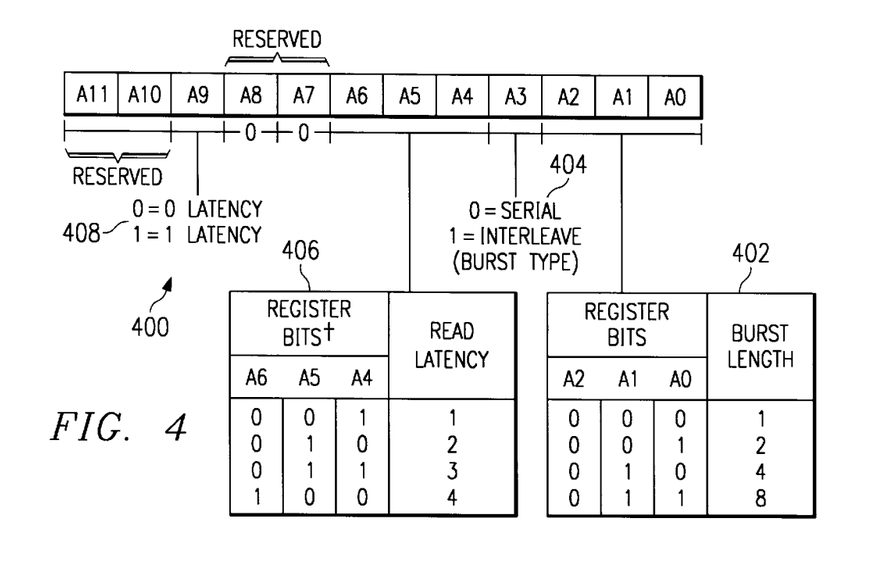
FIG. 4 is a depiction of the input addresses for the mode register of the preferred embodiment circuit of FIG. 2.

FIG. 4 is a diagram 400 representing mode register 202 of FIGS. 2 and 3. As described above, the user of the memory circuit burst length by characteristics such as latency and burst length by providing the appropriate information to the mode register. The mode register 400 contains individual data bits indicating read latency, a burst type, a burst length, and write latency. The mode register 400 is loaded with a mode register set (MRS) command executed by holding RAS_, CAS_ and W_ low with the input mode word being valid on address leads A0–A9 on the rising edge of a clock signal. The MRS command is executed when all banks are deactivated and in their idle state.

A logic zero is entered on address leads A7 and A8 (which are reserved for built-in self-test operations), while address leads A10–A11, BA0, BA1 are don't care entries for the mode register. Chart 402 indicates the allowed logical states for mode register bits A0–A2 in determining a burst length of 1, 2, 4, or 8 bits. Chart 404 indicates that a mode register bit A3 of zero indicates a serial burst type while a logical one indicates an interleave burst type. Chart 406 indicates the mode register bits A4–A6 determining a read latency respectively of 1, 2, 3, and 4. Chart 408 indicates the mode register bit A9 determining a write latency of zero and one, respectively. The mode register is changed only if a valid MRS command is entered. If the addresses are not valid, the previous contents of the mode register remain unchanged.

Figure 5:
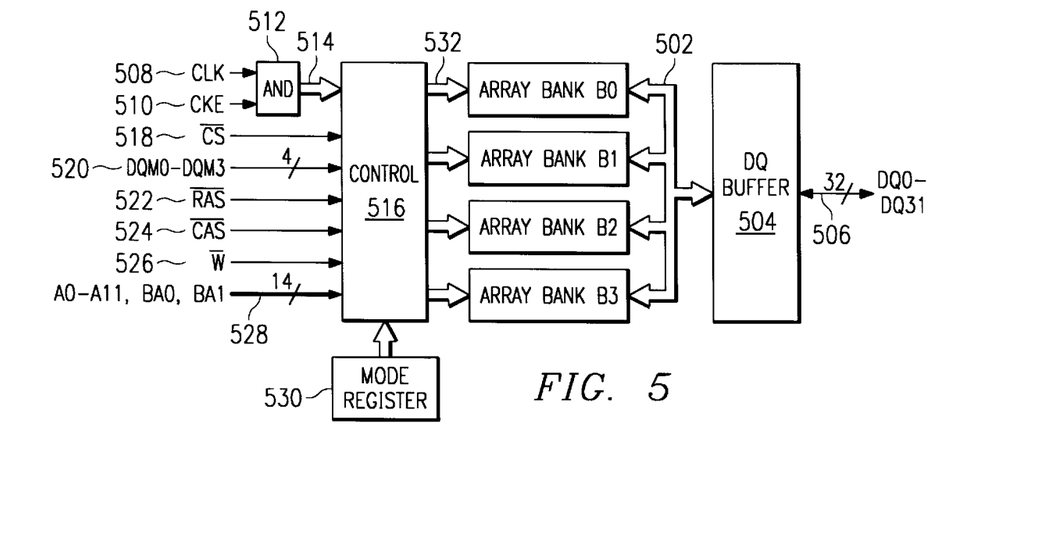
FIG. 5 is a schematic diagram of a memory circuit.

FIG. 5 is a schematic functional diagram of the memory circuit and provides context for the latency and burst control scheme described above. The memory circuit includes four memory cell array banks: B0, B1, B2, and B3 for storing data. Data is transferred between the banks and thirty-two leads DQ0–DQ31 on internal leads represented by leads 502, a DQ buffer 504, and thirty-two individual lead lines 506. In this arrangement, thirty-two data signals may be carried simultaneously on leads 506. As described above, the inventions described herein are equally applicable to memory circuit configurations with more or less than four memory cell arrays and with data paths wider or narrower than thirty-two lines. The latency registers 200 of FIG. 2, for example, are typically placed between the memory cell array banks and the DQ buffer 504.

The data stored in the memory cell array banks are accessed by two clock signals, several control signals, and time-multiplexed row and column address signals. The clock signal CLK on lead 508 and a clock enable signal CKE on lead 510 pass through AND block 512 and across leads 514 to control block 516. An active low chip-select signal CS_ on lead 518 connects to control block 516. DQM0–DQM3 output enable signals on four leads 520 also connect to control block 516. The signals RAS_, CAS_, and W_ appear respectively on leads 522, 524, and 526 connecting to control block 516. Fourteen address signals A0–A11, BA0, and BA1 appear on leads 528 also connecting to control block 516. Mode register 530 connects with control block 516. Control block 516 accesses the data in banks B0, B1, B2, and B3 through leads 532.

The memory circuit is thus a synchronous dynamic random access memory organized as four banks of 2,097,152 words with thirty-two bits of data per word for a total capacity of 268,435,456 data bits. The circuit is also compatible with standards for synchronous DRAMs established by the Joint Electron Device Engineering Council (JEDEC). It will be apparent to one skilled in the art that the memory circuit and various subcircuits described herein are equally applicable to discrete DRAM integrated circuits or to memory circuits embedded with another circuit or circuits, a microprocessor for example, on a single semiconductor die.

Figure 6:
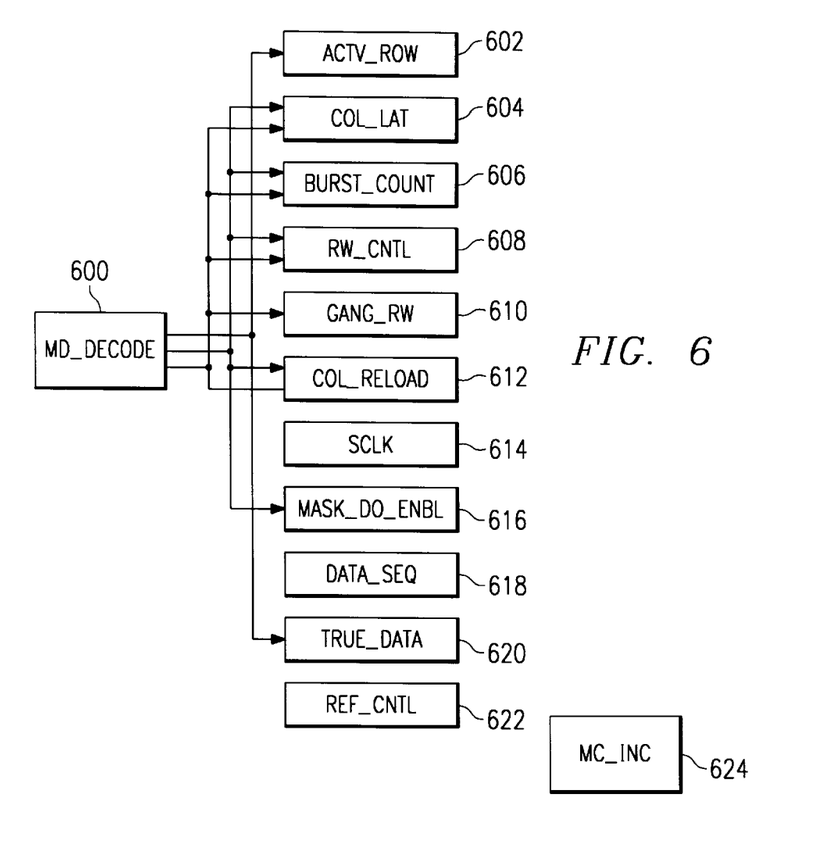
FIG. 6 is a map of the functions within the control block shown in FIG. 5.

FIG. 6 is a map of the functions within control block 516 of FIG. 5. The MD_DECODE block 600 decodes all commands entered into the memory circuit. The block also registers the states during a MRS command such as burst length, latency, and data stream type (such as serial or interleaved). The ACTV_ROW block 602 activates the row selected by inputs on the row address leads 528 in FIG. 5. The COL_LAT block 604 controls the output enable and indicates the end of an internal pre-fetch read command. The BURST_COUNT block 606 counts down burst length. The RW_CNTL block 608 controls the read and write cycle and counts down latency. It provides the functions of block 206 in FIG. 2. The GANG_RW block 610 controls the transfer of data in the pre-fetch register. The COL_RELOAD block 612 increments the y-select address of an 8-bit burst. The SCLK block 614 generates the internal clock based on burst count. For example, the internal clock, IC_SCLK, for an eight-bit burst is shown in FIG. 7a. The SCLK_ENABLE signal gates the external clock, PB_CLK, so that the IC_SCLK results. The gating of the clock allows for the flow-through of a data bit as described below. The MASK_DQ_ENBL block 616 controls data masking and input/output enabling. The DATA_SEQ block 618 controls sequencing of data from and to the memory cell array. The TRUE-DATA block 620 corrects data inversion. The REF_CNTL block 622 time-multiplexes refresh addresses with the SLFR clock. The SLFR clock is a clock signal provided by a separate internal oscillator that runs at a slower rate than the externally-provided clock. The MC_INC block 624 increments a refresh address counter.

The information decoded in the MD_DECODE block 600 is used during a read command, for example, as follows. The RW_CNTL block 608 receives an MD_READ signal from block 600 and with the rising edge of clock PB_CLK, begins decrementing the variable latency counter loaded during the MRS command mentioned above. As mentioned above, a decrementing "down" counter is the preferred embodiment here because it may, be implemented with simpler circuitry than an incrementing counter. In situations where the more complex circuitry is justified, it may of course be advantageous to use such an "up" counter. When the latency counter fully counts down, a signal LAT_DONE is generated to indicate that four bits can be transferred in the pre-fetch register.

Figure 7:
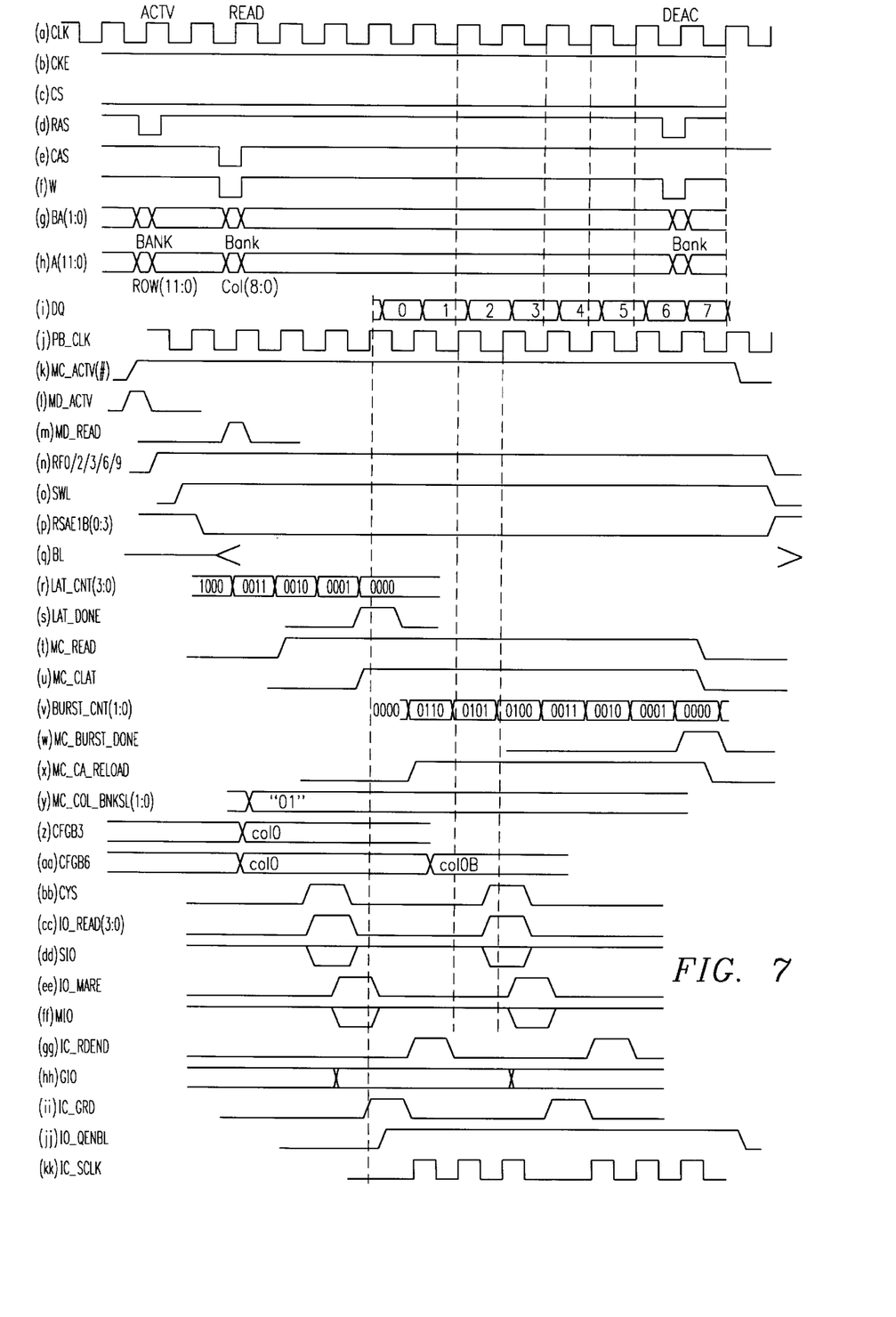
FIG. 7 is a timing diagram for a memory circuit during a read command.
Figure 7A:
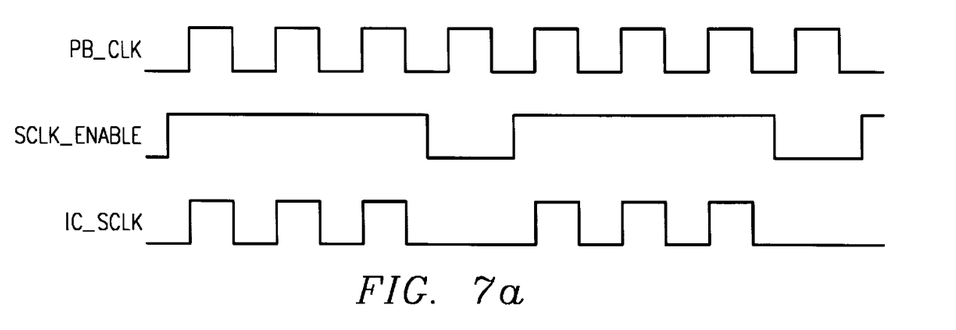
FIG. 7a is a timing diagram showing clock signal gating.

FIG. 7 is a diagram depicting the timing relationships of various signals in the memory circuit during a read command. Signals (a)–(h) are external input signals that are decoded in the control block 516 of FIG. 5. Upon issuance of an ACTV command, the (l) signal, MD_ACTV, in combination with the rising edge of (j), PB_CLK, generates the (k) bank specific activation signal. The bank activation signal places the desired bank active and ready for a write or read cycle to commence. Signal (m), MD_READ, with the rising edge of (j), PB_CLK, captured as it meets the set-up and hold criteria, commences a read cycle. The commencement of the read cycle activates the programmable latency counter (r), LAT_CNT(3:0), to begin counting the latency cycles down. When the latency has expired, the signal (s), LAT_DONE, fires to activate signal (ii), IC_GRD, a slightly delayed version of which appears on line 808 of FIG. 8 as IC_AGRD.

Figure 8A:
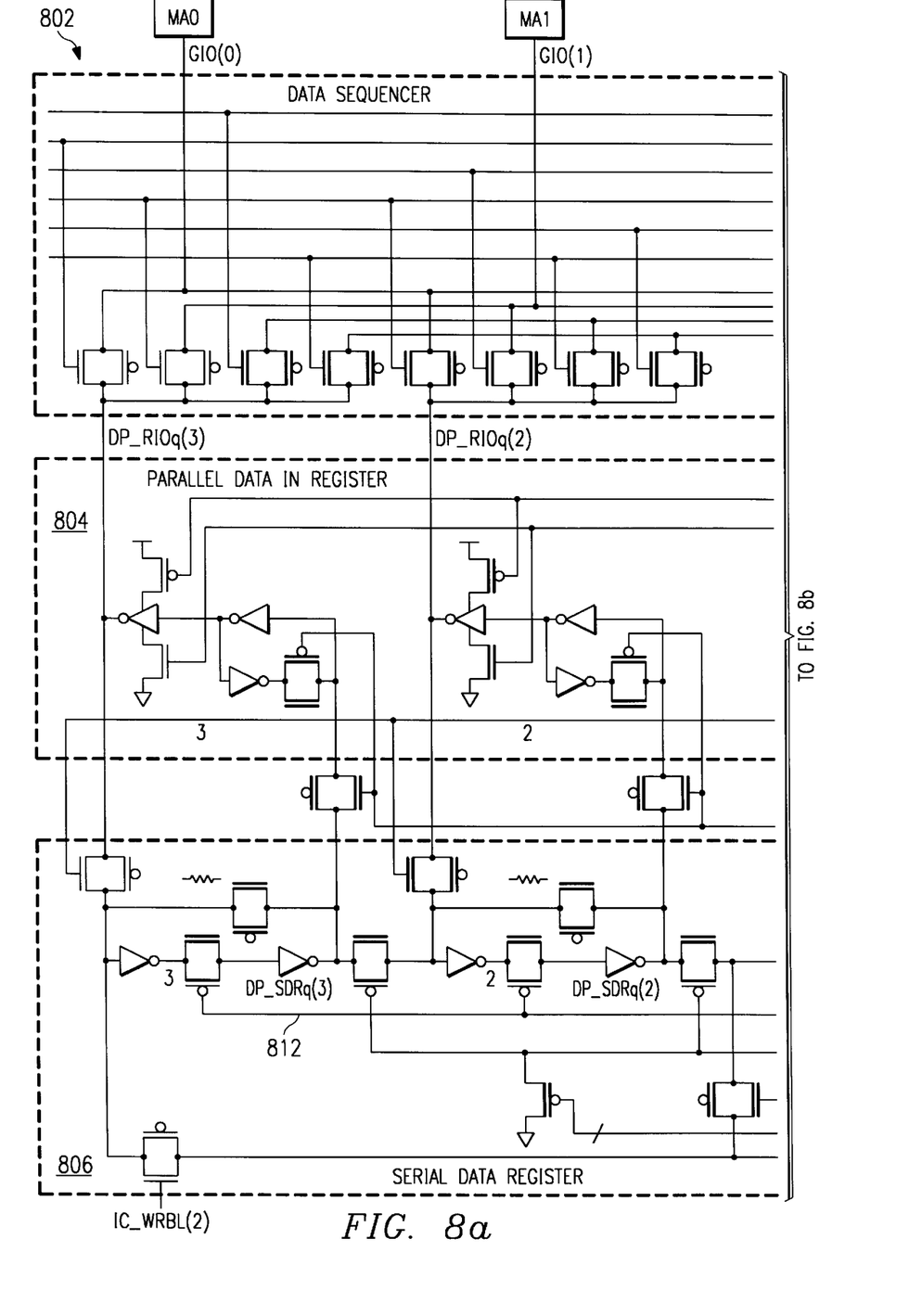
FIGS. 8a–8b, is a diagram of data sequencing, input, and output circuitry for a memory circuit incorporating a pre-fetch scheme.
Figure 8B:
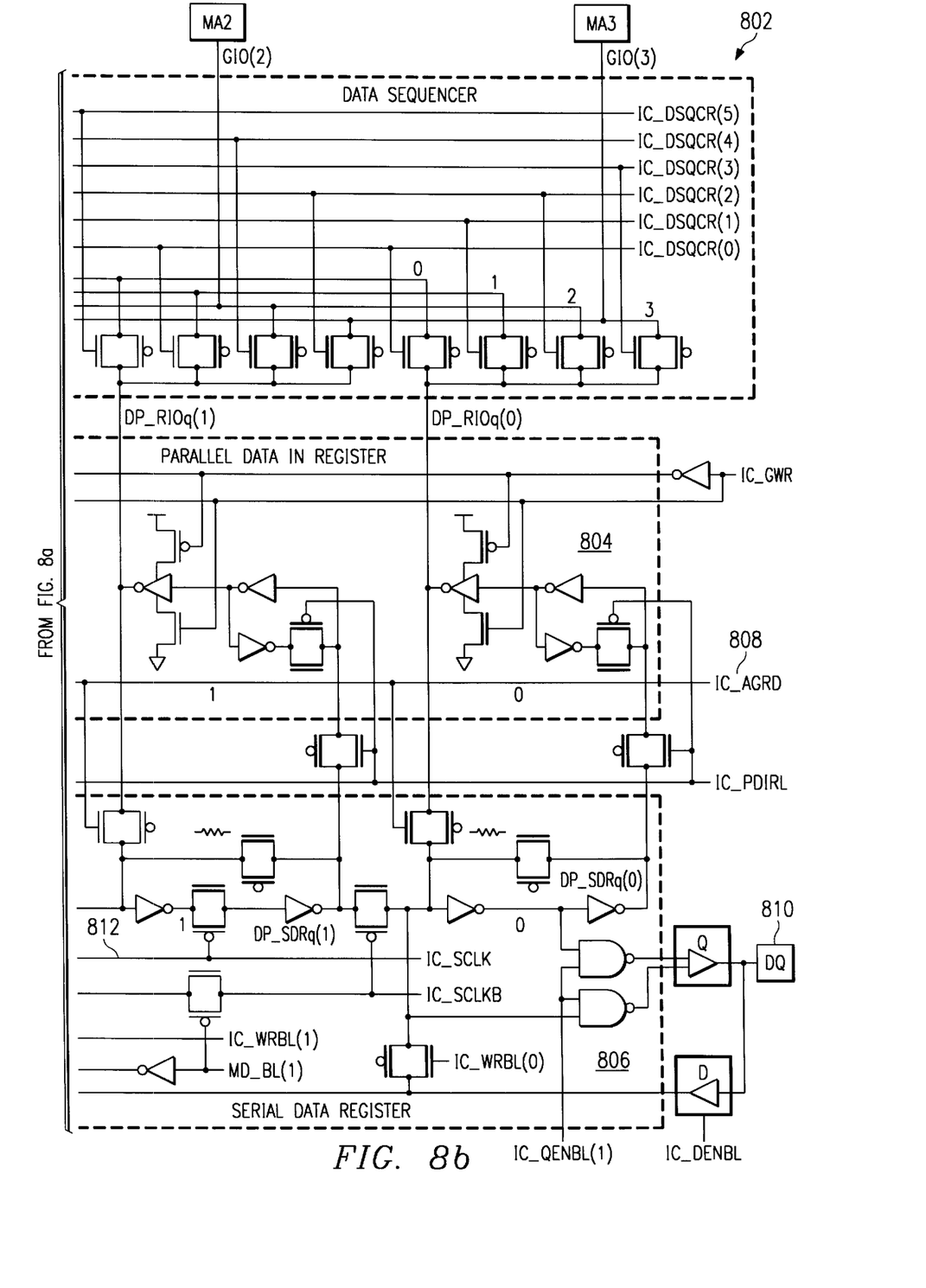

FIG. 8, comprising FIGS. 8a–8b, shows the data-sequencing circuitry 802, input data register 804, and output serial data register 806 for one of the thirty-two DQ output pads 810 of the memory circuit. Activation of signal (ii) supplies signal IC_AGRD on line 808, which transfers latched data from the data-sequencing circuitry 802 to a serial data register 806. After the data is transferred from the data-sequencing circuitry to the serial data register, the signal (kk), IC_SCLK, is applied in the serial data register 806 to line 812, an action that begins the clocking of data out the DQ pad 810.

Figure 9:
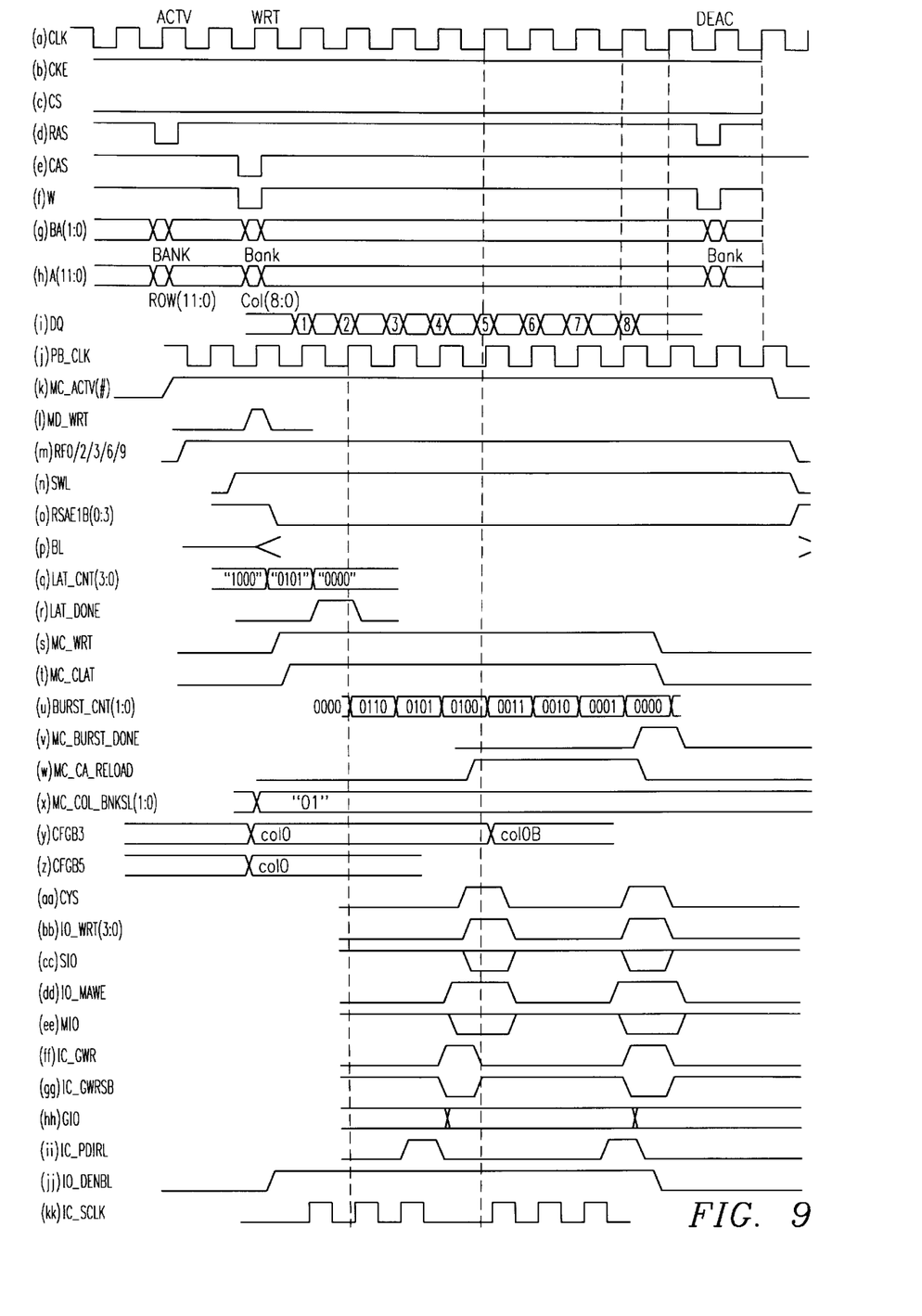
FIG. 9 is a timing diagram for a memory circuit during a write command.
Figure 10A:
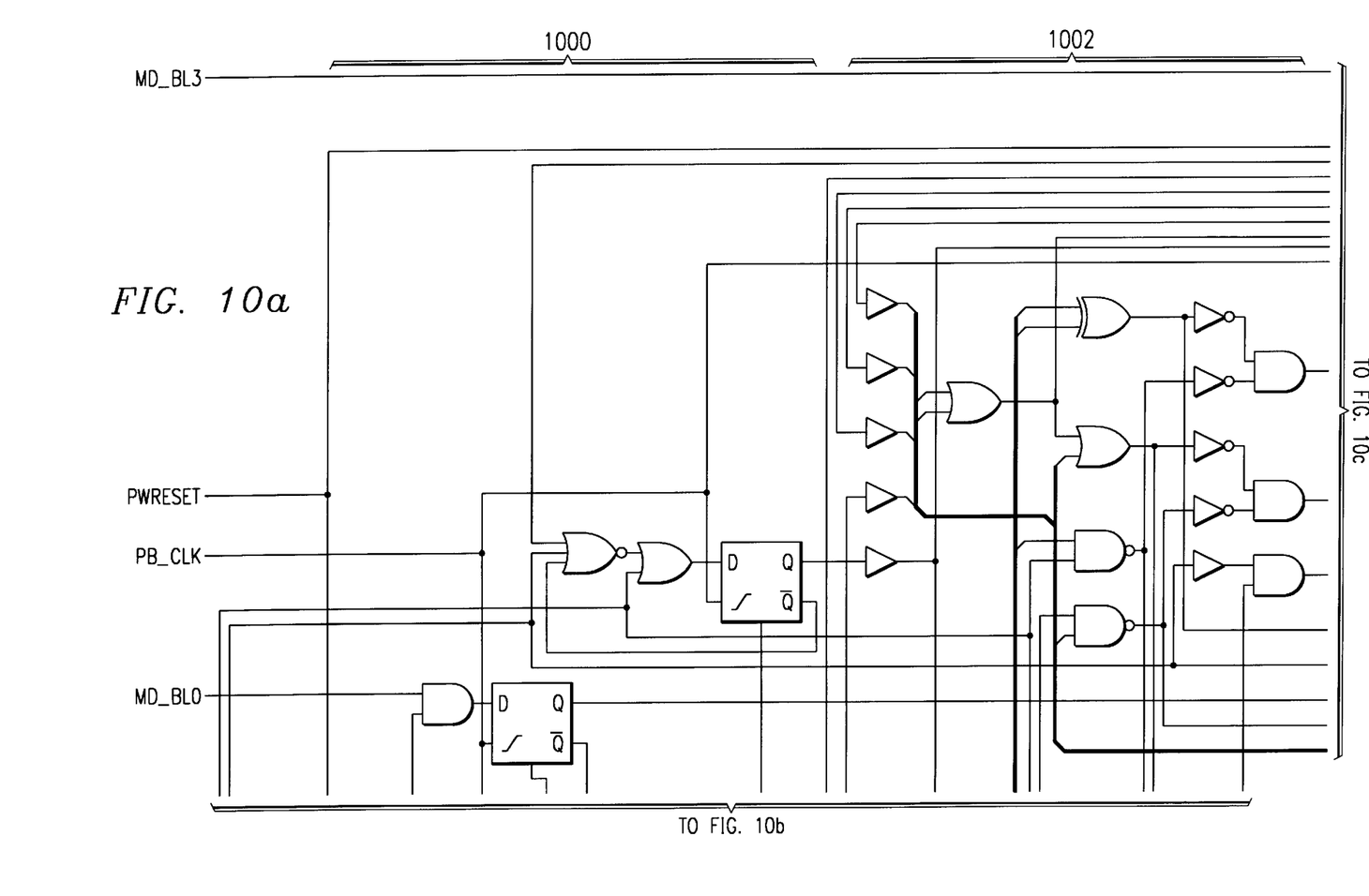
FIGS. 10a–10d, is a schematic diagram of logic circuitry for implementing variable latency in a memory circuit.
Figure 10B:
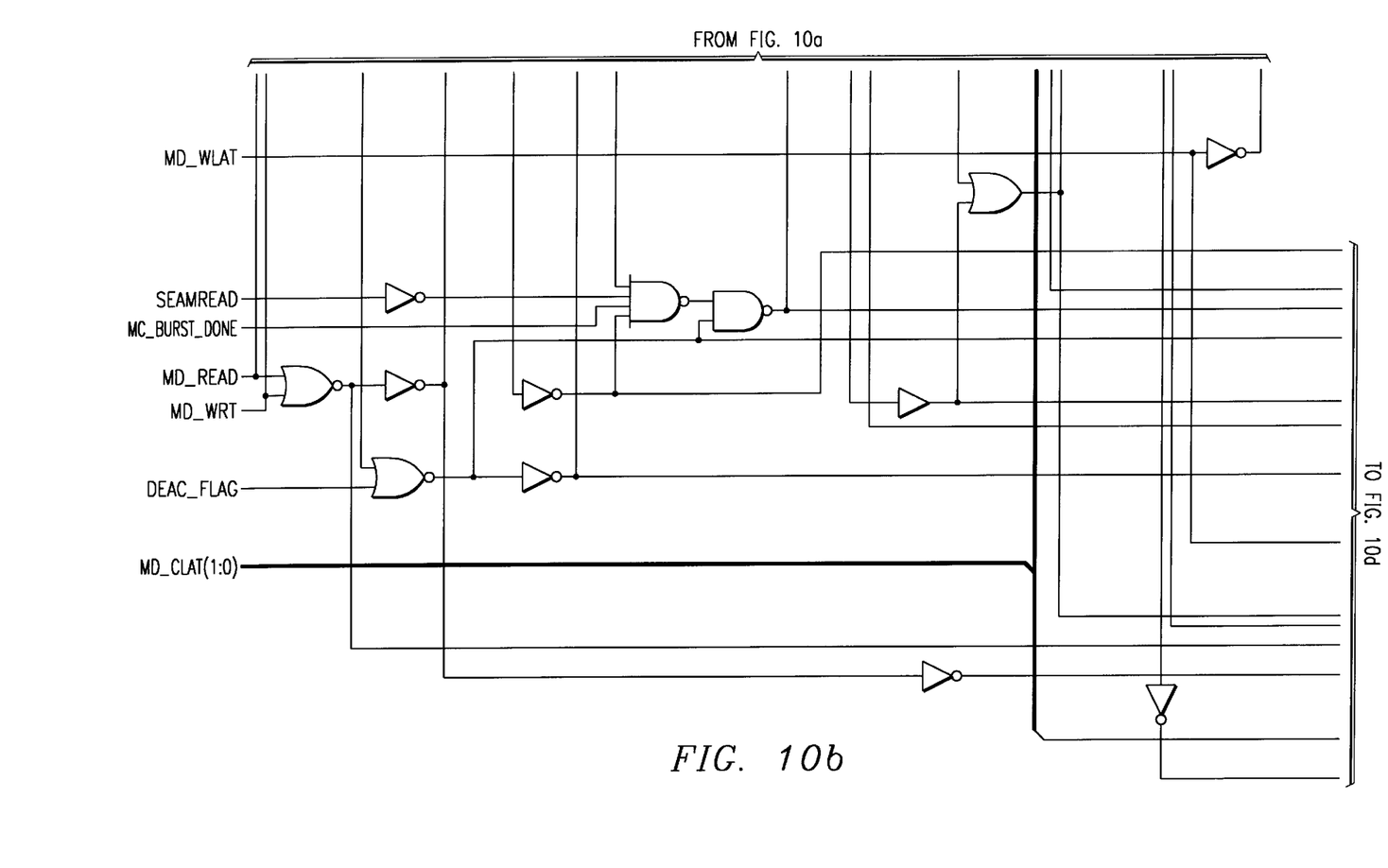
Figure 10C:
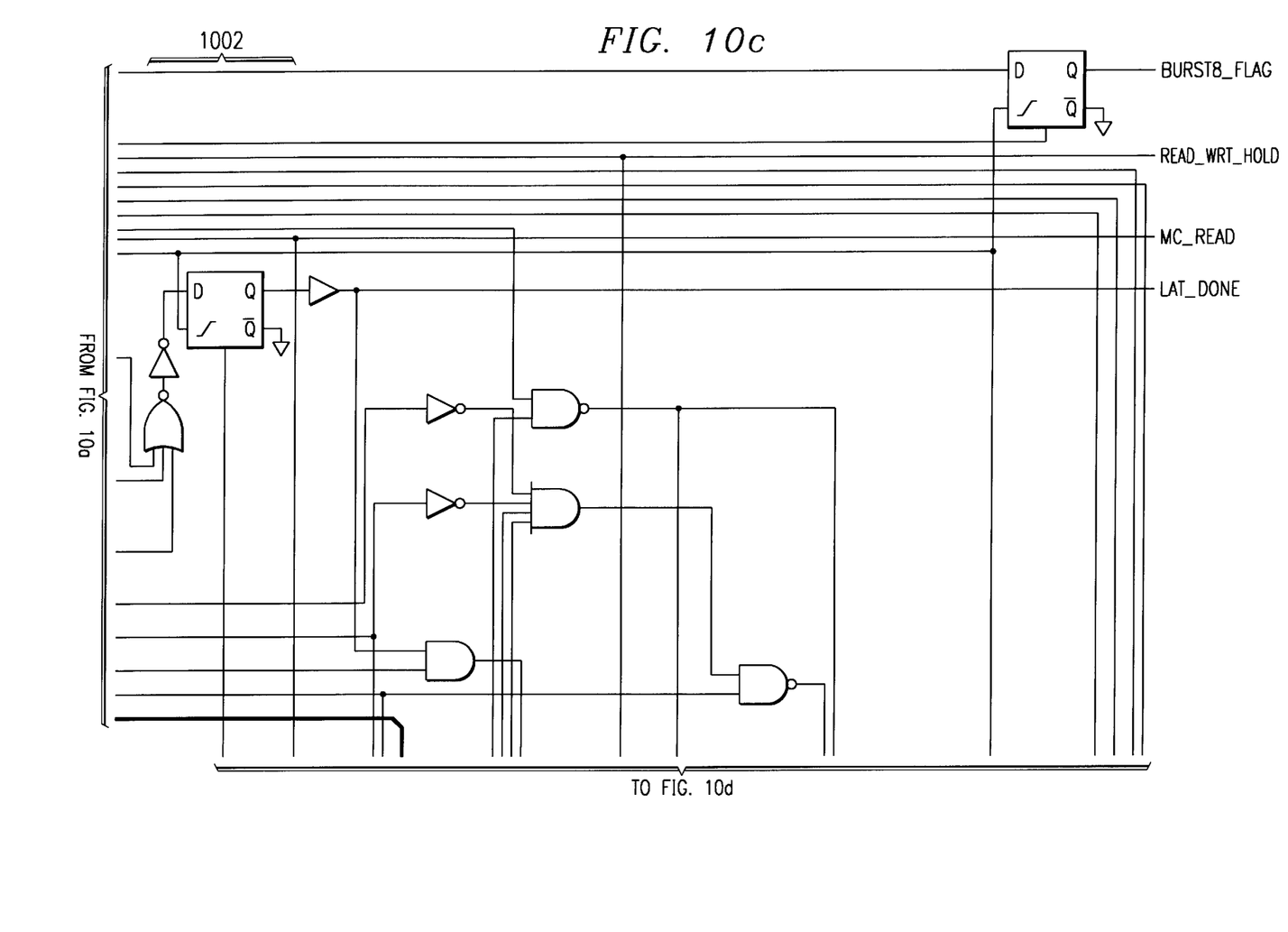
Figure 10D:
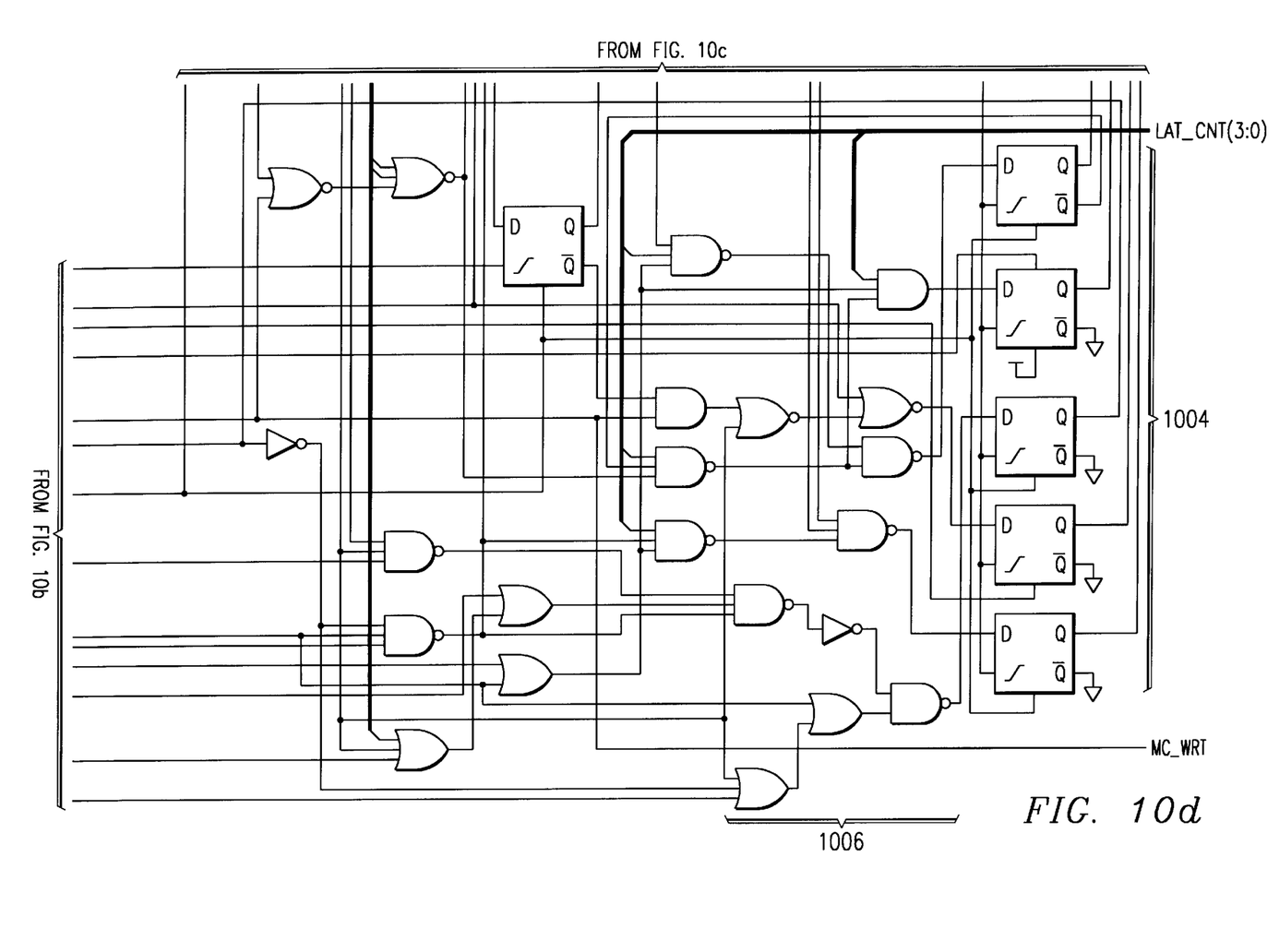

FIG. 9 is a diagram depicting the timing relationships of various signals in the memory circuit during a write command. The write cycle begins with the activation of a selected memory cell array bank, as indicated by the rising level of signal (k), MC_ACTV(#). The signal (l) is generated from the issuance of a WRT command from external inputs (c), (d), (e), and (f). The valid command is detected with a rising edge of signal (j), PB_CLK. This activates the latency counter to begin counting down for write latency of one. After latency has expired, the signal (r), LAT_DONE, fires. For a latency of zero, LAT_CNT is set to zero and LAT_DONE fires immediately with a rising edge of the clock signal, PB_CLK. The sending of the LAT_DONE signal loads the burst counter with burst length information and begins decrementing to generate the signal (kk), IC_SCLK, to serially clock in the data (i) presented at the DQ pad in FIG. 8. The signal, IC_GWR, controls the transfer of data from the parallel data-in register 804 into the data sequencer 802 and then into the memory cell array. A comparison of FIGS. 7 and 9 makes apparent a shifting of the IC_SCLK signal for the read and write cycles accounts for the flow-through bit.

FIG. 10, comprising FIGS. 10a–10d, shows a logic circuit that provides the functions described in circuit block 206 of the circuit shown in FIG. 2 and in the RW_CNTL circuit block 608 of the circuit shown in FIG. 6. The inputs to the circuit of FIG. 10 are shown at the left of the figure and consist of signals from the decode circuitry block 600, MD_DECODE, of FIG. 6. The output signals include the LAT_DONE and LAT_CNT(3:0) signals referred to hereinabove, as well as various read and write control signals. The circuitry indicated generally by element 1000 generates the MC_READ signal shown at line (t) in FIG. 7. The circuitry labeled 1002 generates the LAT_DONE signal and the circuitry labeled 1004 generates the LAT_CNT signal. Circuitry 1006 is the counting circuitry that decrements the LAT_CNT signal.

The logic circuitry of FIG. 10 was generated using hardware description language (VHDL) with a logic synthesis tool. A circuit designer using this technique writes code to specify inputs, outputs, and the desired function of circuitry. A computer then generates the actual circuit diagram. Circuits designed using such synthesis software can thus vary widely depending upon the information given to the computer and still accomplish the same circuit function. For this reason, one skilled in the art will appreciate that the circuit shown in FIG. 10 is simply one embodiment of many that may be possible to achieve the same function. The program code used to generate the circuit of FIG. 10 is provided hereinbelow.

```
-- $Id$ --
--------------------------------------------------------------------------
--------------
--                             copyright (c) 1994-1995
--                             Texas Instruments / Hitachi
--                             All Rights Reserved
--
-- File name        :   RW_CNTL_a.vhdl
-- Title            :   rw_cntl_a.vhdl
-- Module           :   MAIN CONTROL
--
-- Purpose      :   Read or Write activation of one or more banks
--
-- Roadmap      :
--------------------------------------------------------
architecture bhv of rw_cntl is
--------------------------------------------------------
-- Process:READ & WRT control signals
-- Purpose:next version
-- Inputs:
-- Outputs:
--------------------------------------------------------
signal INT_READ_WRT_HOLD : std_logic;
signal READ_WRT_PD : std_logic;
signal INT_LAT_DONE : std_logic;
signal INT_MC_READ : std_logic;
signal INT_MC_WRT : std_logic;
signal INT_LAT_CNT : std_logic_vector(3 downto 0);
signal burst_over : std_logic;
begin
burst_over <= MC_BURST_DONE and (not_PB_CLK) and (not READ_WRT_PD) and(not
SEAMREAD) and (not MD_READ) and (not MD_WRT);
LATENCY: process (PB_CLK, PWRESET,DEAC_FLAG)
     begin
         if(PWRESET = '1' or DEAC_FLAG = '1') then
             INT_LAT_CNT <="1000";   --reset the latency counter
             INT_LAT_DONE <= '0';
```

-continued

```
        elsif (PB_CLK = '1' and PB_CLK'event) then
            INT_LAT_DONE <= '0';
        if(MD_READ = '1')then  -new read issued
            case MD_CLAT(1 downto 0) is
                when "01" => INT_LAT_CNT <= "0000"; INT_LAT_DONE <= '1';  --read
-- latency = 1
                when "10" => INT_LAT_CNT <="0001"; --read latency is 2
                when "11" => INT_LAT_CNT <="0010"; --read latency is 3
                when "00" => INT_LAT_CNT <="0011"; --read latency is 4
                when others => null;
            endcase;
        end if;
        if(MD_WRT = '1' ) the --new wrt issued
            if(MD_WLAT ='0')then
                INT_LAT_CNT ,= "0000";
                INT_LAT_DONE <= '1';
            elseif(MD_WLAT = '1')then
                INT_LAT_CNT <= "0001";
            end if;
        end if;
        if(INT_MC_READ = '1' or INT_MC_WRT= '1') then
            if(INT_LAT_CNT /= "0000") then
                INT_LAT_CNT <= INT_LAT_CNT - "0001"; --dec lat counter at PB_CLK edge
            end if;
            if(INT_LAT_CNT = "0001")then
                INT_LAT_DONE <= '1';
            end if;
        end if;
    end if;
end process LATENCY,
READ_WRITE: process(PB_CLK,PWRESET,burst_over,INT_READ_WRT_HOLD,DEAC_FLAG )
begin -- PROCESS READ_WRITE
    if (PWRESET = '1' or burst_over = '1' or DEAC_FLAG = '1') then
        INT_MC_READ <= '0';
        INT_MC_WRT <= '0';
    elseif (PB_CLK = '1' and PB_CLK'event) then
        if (MD_READ = '1' )then   --new read issued
            INT_MC_READ <= '1';
            INT_MC_WRT <= '0';
        elseif(MD_WRT = '1' ) then   --new wrt issued
            INT_MC_WRT <= 1';
            INT_MC_READ <= '0';
        elseif( INT_READ_WRT_HOLD = '1')then
            INT_MC_WRT <= '0';
            INT_MC_READ <= '0';
        end if;
    end if;  --end of clk
end process READ_WRITE;
-----------------------------------------------------------
BURST8FLAG : process(PWRESET,PB_CLK,MH_BL3)
    begin
        if(PWRESET = '1') then
            BURST8_FLAG <= '0';
        elseif(PB_CLK = '1' and PB_CLK'event) then
            BURST*_FLAG <= MD_BL3;
        end if;
end process BURST8FLAG;
-----------------------------------------------------------
READ_WRT_PD_FLAG; process(PWRESET,PB_CLK,MD_BL0,MD_READ,MD_WRT,DEAC_FLAG)
    begin
    if (PWRESET = '1' or DEAC_FLAG = '1') then
        READ_WRT_PD <= '0';
    elsif (PB_CLK = '1' and PB_CLK'event) then
        READ_WRT_PD <= '0';
        if(MD_BL0='1' and (MD_WRT= '1')) then
            READ_WRT_PD <= '1';
        end if;
    end if;  --end of clk
end process READ_WRT_PD_FLAG;
READ_WRT_HOLD_FLAG : process(PWRESET,PB_CLK,READ_WRT_PD,DEAC,FLAG,
INT_LAT_DONE)
    begin
    if (PWRESET = '1' DEAC_FLAG = '1') then
        INT_READ_WRT_HOLD < = '0';
    elseif (PB_CLK = '0' and PB_CLK'event) then
        INT_READ_WRT_HOLD <= '0';
        if(READ_WRT_HOLD <= '1';
        end if;
    end if;  --end of clk
end process READ_WRT_HOLD_FLAG;
```

```
-continued
READ_WRT_HOLD <= INT_READ_WRT_HOLD;
LAT_CNT <= int_LAT_CNT;
LAT_DONE <= INT_LAT_DONE;
MC_READ <= INT_MC_READ;
MC_WRT <= INT_MC_WRT;
end bhv;
```

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory integrated circuit, comprising:
    a memory cell array;
    data lines for transferring data to and from said memory cell array;
    data storage circuitry coupled between said memory cell array and said data lines;
    a mode register circuit coupled to receive latency data, the mode register circuit arranged to produce a latency signal; and
    a counter circuit coupled to receive the latency signal from the mode register circuit, the counter circuit coupled to the data storage circuitry, the counter circuit arranged to inhibit said transferring data in said data storage circuitry prior to a predetermined state of said latency signal and a clock signal, the counter circuit arranged to release said data in said data storage circuitry in response to said predetermined state.

2. The integrated circuit of claim 1, wherein said data storage circuitry comprises a latch.

3. The integrated circuit of claim 2, wherein said latch is arranged to store said data transferred to said memory cell array and said data transferred from said memory cell array.

4. The integrated circuit of claim 1, wherein said predetermined state comprises said counter circuit counting a predetermined number of cycles of said clock signal prior to releasing said data in said data storage circuitry.

5. The integrated circuit of claim 4, wherein said predetermined number of cycles corresponds to said latency data.

6. The integrated circuit of claim 1, further comprising circuitry for transferring data to or from said array in a burst comprising a plurality of data bits.

7. The integrated circuit of claim 6, wherein said mode register is further coupled to receive burst length data and wherein a number of the plurality of data bits corresponds to the burst length data.

8. The integrated circuit of claim 6, wherein said mode register is further coupled to receive burst order data and wherein an order of the plurality of data bits corresponds to the burst order data.

9. A memory integrated circuit, comprising:
    a memory cell array;
    a clock signal input;
    data lines for transferring data to and from said memory cell array;
    latches coupled between said memory cell array and said data lines for storing data to be transferred to or from said memory cell array;
    a mode register containing latency input data; and
    a counting circuit coupled to said mode register, said latches, and said clock signal input, said counting circuit providing a signal to release data from said latches after the lapse of a predetermined number of cycles of said clock signal, said predetermined number of cycles corresponding to said latency input data.

10. The memory integrated circuit of claim 9, further comprising circuitry for transferring data to or from said array in a burst comprising a plurality of data bits, the first of said plurality of data bits transferred in response to said signal from said counting circuit to said latches to release data from said latches, said plurality of data bits determined by burst length input data in said mode register.

11. The memory integrated circuit of claim 9; further comprising read and write control circuitry, and wherein said predetermined number of cycles of said clock signal is measured from a read or write command to said read and write control circuitry.

12. The memory integrated circuit of claim 11, wherein said predetermined number of cycles from a read command is selected from one, two, four, or eight cycles.

13. The memory integrated circuit of claim 11, wherein said predetermined number of cycles from a write command is selected from zero or one cycle.

14. A method for coordinating input and output of data from a memory cell array with a clock signal, said method comprising the steps of:
    storing data to be transferred to or from said memory cell array in data storage circuitry connected to said memory cell array;
    counting a predetermined number of cycles of said clock signal;
    providing a signal to said data storage circuitry after the lapse of said predetermined number of clock cycles; and
    releasing said stored data.

15. The method of claim 14, wherein said step of releasing said stored data comprises releasing a burst of data comprising a plurality of data bits.

16. The method of claim 15, further comprising the step of programming a mode register with burst length data, and producing a burst length signal in response to the burst length data, wherein said plurality of data bits correspond in number to the burst length signal.

17. The method of claim 15, further comprising the step of programming a mode register with burst order data, and producing a burst order signal in response to the burst order data, wherein said plurality of data bits correspond in order to the burst order signal.

18. The method of claim 14, wherein said step of storing data comprises latching data to be read from or written to said array.

19. The method of claim 18, wherein said latching data comprises storing data to be written to said array and data to be read from said array in a latch.

20. The method of claim 14, further comprising the step of selecting said predetermined number of cycles as one, two, four, or eight cycles measured from a read command.

21. The method of claim 14, further comprising the step of selecting said predetermined number of cycles as zero or one cycle measured from a write command.

* * * * *